US012721071B2

(12) United States Patent
Aydin et al.

(10) Patent No.: US 12,721,071 B2
(45) Date of Patent: Aug. 25, 2026

(54) SELECTIVITY OF BORON HARD MASKS USING ION IMPLANT

(71) Applicant: Applied Materials, Inc., Santa Clara, CA (US)

(72) Inventors: Aykut Aydin, Sunnyvale, CA (US); Rajesh Prasad, Lexington, MA (US); Fenglin Wang, Lexington, MA (US); Rui Cheng, San Jose, CA (US); Karthik Janakiraman, San Jose, CA (US); Kyu-Ha Shim, Andover, MA (US)

(73) Assignee: Applied Materials, Inc., Santa Clara, CA (US)

( * ) Notice: Subject to any disclaimer, the term of this patent is extended or adjusted under 35 U.S.C. 154(b) by 201 days.

(21) Appl. No.: 18/495,493

(22) Filed: Oct. 26, 2023

(65) Prior Publication Data

US 2025/0140566 A1 May 1, 2025

(51) Int. Cl.
*H10P 30/40* (2026.01)
*C23C 16/56* (2006.01)
(Continued)

(52) U.S. Cl.
CPC .............. *H10P 30/40* (2026.01); *C23C 16/56* (2013.01); *H10B 12/01* (2023.02); (Continued)

(58) Field of Classification Search
None
See application file for complete search history.

(56) References Cited

U.S. PATENT DOCUMENTS

2005/0042879 A1* 2/2005 Yin ..................... H01L 21/3088 257/E21.232
2017/0062218 A1 3/2017 Duan et al.
(Continued)

FOREIGN PATENT DOCUMENTS

CN 103177942 * 6/2013 ........... H01L 21/266
TW 201709332 A 3/2017

OTHER PUBLICATIONS

International Application No. PCT/US2024/052201, International Search Report and Written Opinion mailed on Feb. 5, 2025, 10 pages.

(Continued)

*Primary Examiner* — Jiong-Ping Lu
(74) *Attorney, Agent, or Firm* — Kilpatrick Townsend & Stockton LLP

(57) ABSTRACT

Thicker hardmasks are typically needed for etching deeper capacitor holes in a DRAM structure. Instead of increasing the hardmask thickness, hardmasks may instead be formed with an increased etch selectivity relative to the underlying semiconductor structure. For example, boron-based hardmasks may be formed that include a relatively high percentage of boron (e.g., greater than 90%). The etch selectivity of the hardmask may be improved by performing an ion implant process using different types of ions. The ion implant may take place before or after opening the hardmask with the pattern for the DRAM capacitor holes. Some designs may also tilt the semiconductor substrate relative to the ion implant process and rotate the substrate to provide greater ion penetration throughout a depth of the openings in the hardmask.

18 Claims, 8 Drawing Sheets

(51) Int. Cl.

| | |
|---|---|
| ***H10B 12/00*** | (2023.01) |
| ***H10P 14/60*** | (2026.01) |
| ***H10P 14/68*** | (2026.01) |
| ***H10P 50/00*** | (2026.01) |
| ***H10P 50/28*** | (2026.01) |
| ***H10P 76/40*** | (2026.01) |

(52) U.S. Cl.

CPC .......... *H10P 14/6518* (2026.01); *H10P 14/68* (2026.01); *H10P 50/282* (2026.01); *H10P 50/73* (2026.01); *H10P 76/405* (2026.01); *H10P 76/4085* (2026.01)

(56) References Cited

U.S. PATENT DOCUMENTS

| | | | |
|---|---|---|---|
| 2020/0357640 | A1 | 11/2020 | Prasad et al. |
| 2021/0035982 | A1 | 2/2021 | Liu et al. |
| 2022/0181151 | A1 | 6/2022 | Shin et al. |
| 2022/0230887 | A1 | 7/2022 | Shek et al. |

OTHER PUBLICATIONS

Taiwanese Application No. 113140308, Office Action mailed on Sep. 2, 2025, 7 pages (1 page of English Translation and 6 pages of original documents).

* cited by examiner

800

| Ion Species | Energy (keV) | Dose (#/cm$^2$) | Anneal 30min @ 600° | Pre-etch TEM thk (Å) | Post-etch TEM thk (Å) | Etch Amount (Å) | ES Improvement |
|---|---|---|---|---|---|---|---|
| B | 60 | 5E+15 | - | 2807 | 1942 | 865 | 1.055 |
| B | 60 | 1E+16 | - | 2811 | 1957 | 854 | 1.069 |
| B | 60 | 5E+15 | X | 2800 | 1926 | 874 | 1.045 |
| In | 35 | 1E+15 | - | 2810 | 1897 | 913 | 1.000 |
| In | 35 | 5E+15 | - | 2801 | 1851 | 950 | 0.961 |
| In | 35 | 1E+15 | X | 2796 | 2016 | 780 | 1.171 |
| In | 35 | 5E+15 | X | 2802 | 1968 | 934 | 0.978 |
| He | 32.5 | 5E+15 | - | - | 2012 | 815 | 1.120 |
| Ne | 60 | 5E+15 | - | - | 2013 | 814 | 1.121 |
| Ne | 60 | 1E+16 | - | 2952 | 2008 | 944 | 0.967 |
| [none] | | | - | 2809 | 1896 | 913 | 1.000 |

FIG. 8

SELECTIVITY OF BORON HARD MASKS USING ION IMPLANT

TECHNICAL FIELD

This disclosure generally describes boron hardmasks used to etch Dynamic Random-Access Memory (DRAM) features. More specifically, this disclosure describes using ion implants in the boron hard mask to improve the selectivity of the hard mask.

BACKGROUND

Integrated circuits are made possible by processes which produce intricately patterned material layers on substrate surfaces. Producing patterned material on a substrate requires controlled methods for forming and removing material. Material characteristics may affect how the device operates, and may also affect how the films are removed relative to one another. Deposition processes produce films having certain characteristics. Many films that are formed require additional processing to adjust or enhance the material characteristics of the film in order to provide suitable properties.

Thus, there is a need for improved systems and methods that can be used to produce high quality devices and structures. These and other needs are addressed by the present technology.

SUMMARY

In some embodiments, a method of forming hardmasks may include, in a first semiconductor processing chamber: delivering a boron-containing precursor to a processing region of a semiconductor processing chamber; forming a plasma of all precursors within the processing region of the first semiconductor processing chamber; and forming a boron-based hardmask on a substrate disposed within the processing region of the first semiconductor processing chamber. The method may also include, in a second semiconductor processing chamber: implanting the boron-based hardmask with ions.

In some embodiments, a method may also include forming a Dynamic Random Access Memory (DRAM) structure comprising a plurality of alternating layers of oxide and nitride materials. The method may additionally include forming a boron-based hardmask over the DRAM structure, where the boron-based hardmask may include at least 90% boron. The method may additionally include implanting the boron-based hardmask with ions. The method may further include opening the boron-based hardmask with a pattern for a plurality of capacitor holes to be formed in the DRAM structure. The method may also include performing an etch to form the plurality of capacitor holes in the DRAM structure through the openings in the boron-based hardmask, where implanting the boron-based hardmask with the ions increases a selectivity of the etch of the DRAM structure relative to the boron-based hardmask.

In some embodiments, a method may include forming a boron-based hardmask over a semiconductor structure. The method may also include opening the boron-based hardmask with a pattern for a plurality of holes to be formed in the semiconductor structure. The method may additionally include tilting a substrate support in a semiconductor processing chamber to tilt the semiconductor structure relative to an ion implant process. The method may further include implanting the boron-based hardmask with ions using the ion implant process wherein tilting the substrate implants the ions at an angle in vertical sidewalls of a plurality of openings in the boron-based hardmask.

In any embodiments, any and all of the following features may be implemented in any combination and without limitation. In the first semiconductor processing chamber: a dopant-containing precursor may be delivered with the boron-containing precursor to the processing region of the first semiconductor processing chamber, and a dopant concentration within the boron-based hardmask may be maintained at less than or about 10 at. %. The dopant-containing precursor may include silicon. The ions may be implanted using a high ion-beam current to implant the ions in the boron-based hardmask. The ions may include indium ions, helium ions, and/or neon ions. Implanting the boron-based hardmask with the ions may increase the selectivity of the etch of the DRAM structure relative to the boron-based hardmask by at least 10%. The ions may be implanted in the boron-based hardmask to a depth greater than about 50% of a thickness of the boron-based hardmask, and the boron-based hardmask may have a thickness of at least 3000 Å. The boron-based hardmask may be implanted with the ions prior to opening the boron-based hardmask. The boron-based hardmask may be annealed prior to opening the boron-based hardmask. The ions may be implanted in the boron-based hardmask prior to opening the boron-based hardmask. The ions may be implanted in the boron-based hardmask to a depth greater than about 80% of a thickness of the boron-based hardmask. The boron-based hardmask may be annealed after opening the boron-based hardmask. An etch may be performed to form the plurality of holes in the semiconductor structure through the openings in the boron-based hardmask, where implanting the boron-based hardmask with the ions may increase the selectivity of the etch of the semiconductor structure relative to the boron-based hardmask by at least 10%. A critical dimension of the plurality of holes may be at least 15:1. A depth of the plurality of holes may be at least 300 nm. The selectivity of the etch may be increased by at least 15%.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

FIG. 8 illustrates a table listing processing conditions for a number of different species with ion implant recipes used in the ion implant process, according to some embodiments.

DETAILED DESCRIPTION

Figure 1:
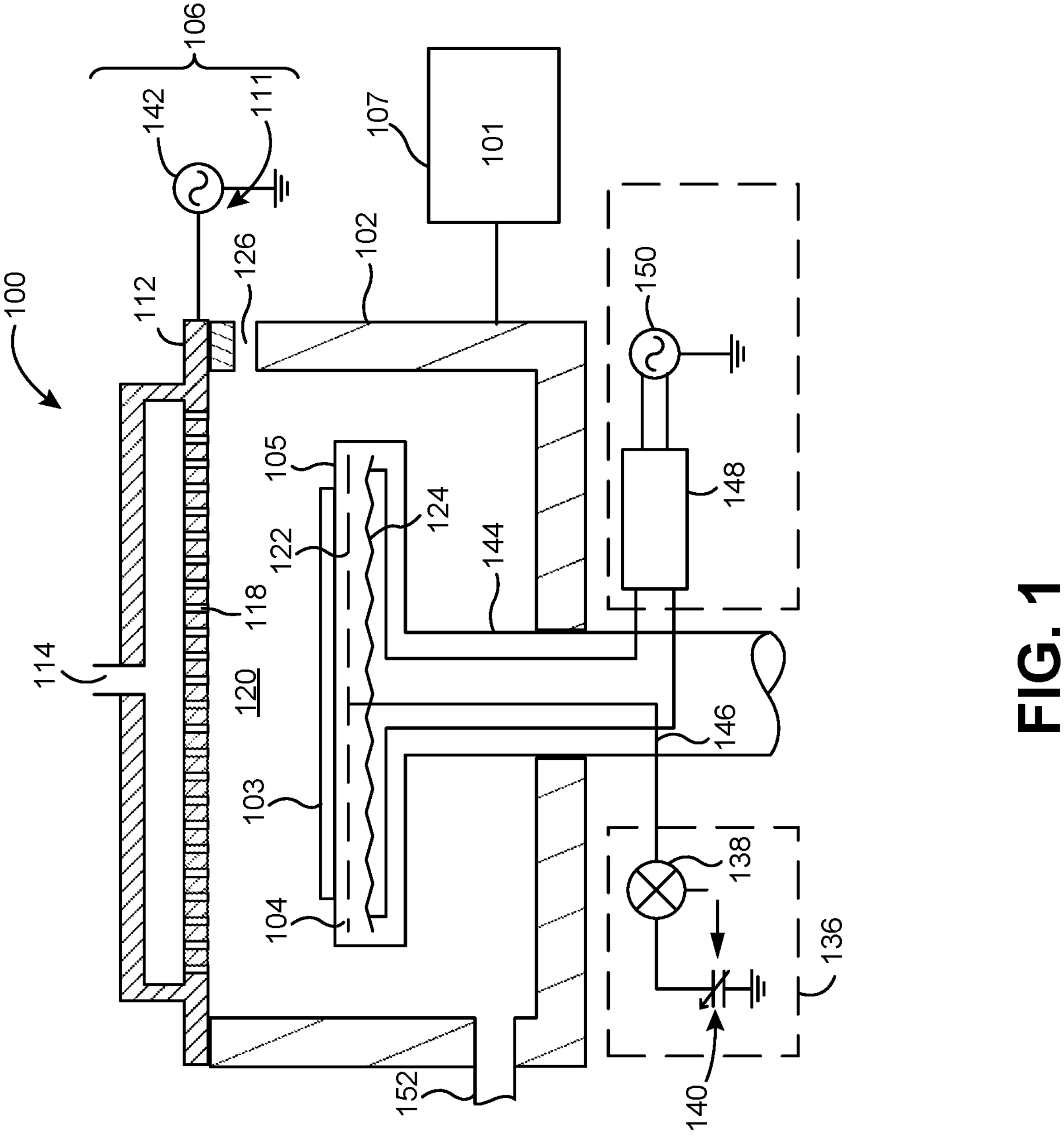
FIG. 1 shows a cross-sectional view of an exemplary processing chamber, according to some embodiments.

During semiconductor fabrication, structures may be produced on a substrate utilizing a variety of deposition and etching operations. Mask materials may be used to allow materials to be at least partially etched to produce features across the substrate. As device sizes continue to shrink, an improved selectivity between materials may ease structural formation, and utilizing improved hard masks may facilitate fabrication. For example, future DRAM nodes may require taller capacitor structures, which may involve forming deeper trenches on a substrate. Conventional hard masks may reach a limitation in selectivity relative to underlying silicon materials. Accordingly, many semiconductor fabrication processes are utilizing thicker hardmask films for larger vertical device structures, or attempting to develop mask materials characterized by increased hardness. However, thicker hard mask films may challenge patterning, which may in turn affect uniformity of transfer into the underlying structure. Thicker hard masks also inherently increase the depth of the etch performed on the underlying device materials, which causes difficulty in maintaining high aspect ratios.

The present technology may overcome these limitations by forming hardmasks with increased etch selectivity relative to the underlying semiconductor structure. For example, boron-based hardmasks may be formed that include a relatively high percentage of boron (e.g., greater than 90%). The etch selectivity of the hardmask may be improved by performing an ion implant process using different types of ions. The ion implant may take place before or after opening the hardmask with the pattern for the DRAM capacitor holes. Some designs may also tilt the semiconductor substrate relative to the ion implant process and rotate the substrate to provide greater ion penetration throughout a depth of the openings in the hardmask. It is to be understood that the present technology is not intended to be limited to the specific films and processing discussed, as the techniques described may be used to improve a number of film formation processes, and may be applicable to a variety of processing chambers and operations. Specifically, boron-based hardmasks are used herein as an example, but they are not meant to be limiting. The same techniques for implanting ions in the hardmask may also be used with any other type of hardmask material or composition. Therefore, the boron-based hardmasks described throughout this disclosure may be replaced with any other type of hardmasks without limitation.

After describing general aspects of a chamber according to some embodiments of the present technology in which plasma processing operations discussed below may be performed, specific methodology may be discussed. It is to be understood that the present technology is not intended to be limited to the specific films, chambers or processes discussed, as the techniques described may be used to improve a number of film formation processes, and may be applicable to a variety of processing chambers and operations.

FIG. 1 shows a cross-sectional view of an exemplary processing chamber 100, according to some embodiments. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers, etch material layers, form other material layers, or a combination thereof, although it is to be understood that deposition and etch methods may similarly be performed in any chamber within which deposition and etch processes may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. In some embodiments, the substrate support 104 may be rotatable, along a vertical axis, where a shaft 144 of the substrate support 104 may be located, or may be stationary. Alternatively, the substrate support 104 may be lifted up to rotate as necessary during a deposition process.

A gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

A first electrode 122 may be coupled with the substrate support 104. The first electrode 122 may be embedded within the substrate support 104 or coupled with a surface of the substrate support 104. The first electrode 122 may be a plate, a perforated plate, a mesh, a wire screen, or any other distributed arrangement of conductive elements. The first electrode 122 may be a tuning electrode and may be coupled with a tuning circuit 136 by a conduit 146, for example a cable having a selected resistance, such as 50 ohms, for example, disposed in the shaft 144 of the substrate support 104. The tuning circuit 136 may have an electronic sensor 138 and an electronic controller 140, which may be a variable capacitor. The electronic sensor 138 may be a voltage or current sensor and may be coupled with the electronic controller 140 to provide further control over plasma conditions in the processing volume 120.

A second electrode 124, which may be a bias electrode and/or an electrostatic chucking electrode, may be coupled with the substrate support 104. The second electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power. The substrate support 104 may also include one or more heating elements configured to heat the substrate to a processing temperature, which may be between about 25° C. and about 800° C. or greater.

The lid assembly 106 and substrate support 104 of FIG. 1 may be used with any processing chamber for plasma or thermal processing. In operation, the processing chamber 100 may afford real-time control of plasma conditions in the processing volume 120, such as via a controller 101 which may be contained within a processor 107. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the second electrode 124 in some embodiments.

Upon energizing a plasma in the processing volume 120, a potential difference may be established between the plasma and the first electrode 122. The electronic controller 140 may then be used to adjust the flow properties of the ground paths represented by the tuning circuit 136. A set point may be delivered to the tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Tuning circuit 136 may have a variable impedance that may be adjusted using the electronic controller 140. Where the electronic controller 140 is a variable capacitor, the capacitance range of each of the variable capacitors, may be chosen to provide an impedance range. This range may depend on the frequency and voltage characteristics of the plasma, which may have a minimum in the capacitance range of each variable capacitor. Hence, when the capacitance of the electronic controller 140 is at a minimum or maximum, impedance of the tuning circuit 136 may be high, resulting in a plasma shape that has a minimum aerial or lateral coverage over the substrate support. When the capacitance of the electronic controller 140 approaches a value that minimizes the impedance of the tuning circuit 136, the aerial coverage of the plasma may grow to a maximum, effectively covering the entire working area of the substrate support 104. As the capacitance of the electronic controller 140 deviates from the minimum impedance setting, the plasma shape may shrink from the chamber walls and aerial coverage of the substrate support may decline.

The electronic sensor 138 may be used to tune the tuning circuit 136 in a closed loop. A set point for current or voltage, depending on the type of sensor used, may be installed in each sensor, and the sensor may be provided with control software that determines an adjustment to the electronic controller 140 to minimize deviation from the set point. Consequently, a plasma shape may be selected and dynamically controlled during processing. It is to be understood that, while the foregoing discussion is based on electronic controller 140, which may be a variable capacitor, any electronic component with adjustable characteristic may be used to provide tuning circuit 136 with adjustable impedance.

Figure 2:
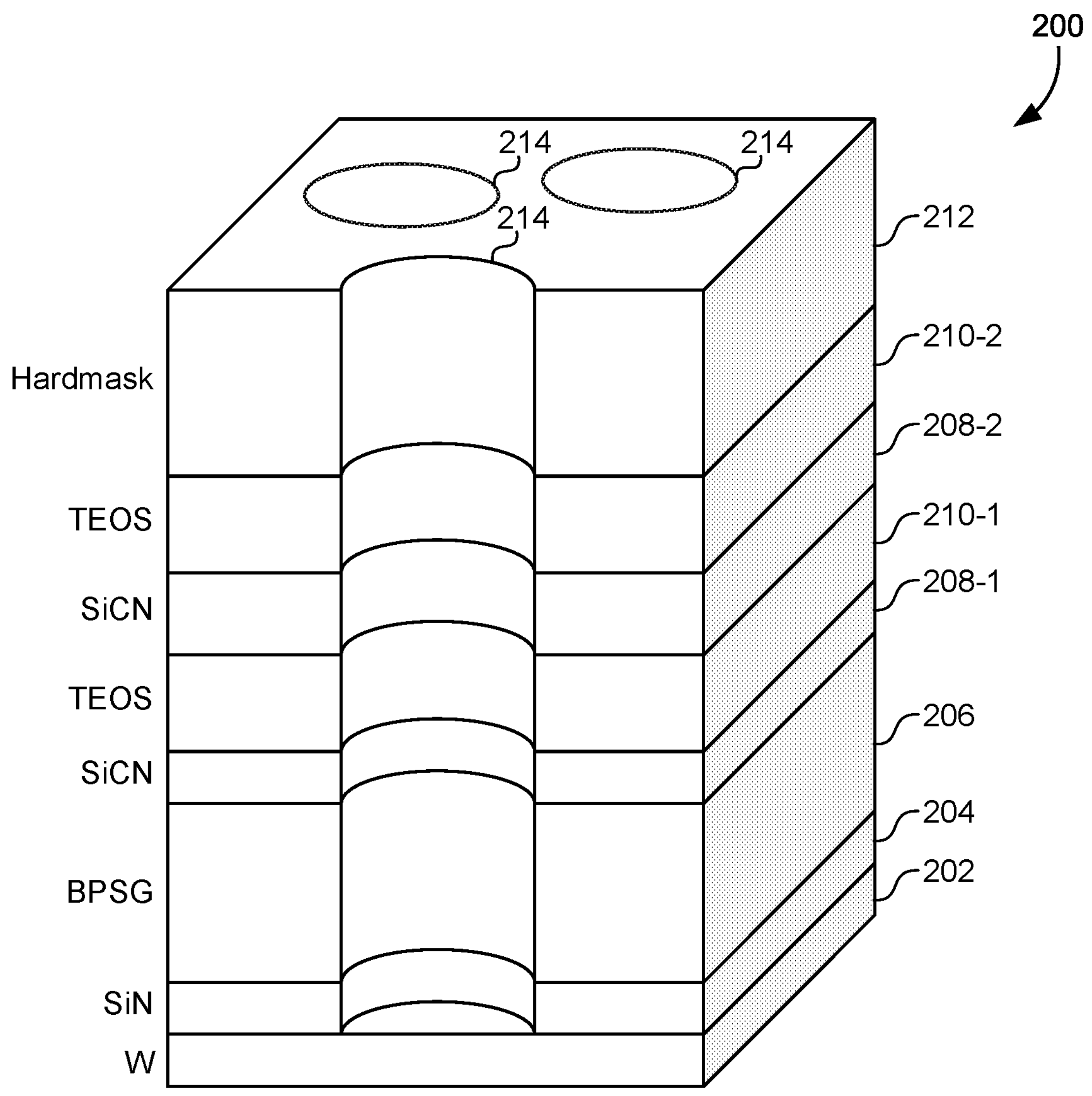
FIG. 2 illustrates a portion of a DRAM structure during fabrication, according to some embodiments.

FIG. 2 illustrates a portion of a DRAM structure 200 during fabrication, according to some embodiments. The DRAM structure may include capacitors holes 214. Note that this DRAM structure 200 only represents a portion of the overall structure for the sake of clarity in illustrating the capacitor holes 214. In practice, the DRAM structure 200 may include many additional layers through which the capacitor holes 214 are formed. Therefore, the DRAM structure 200 should be interpreted as optionally including additional layers that are not shown, in addition to layers between the layers illustrated explicitly in FIG. 2.

The DRAM structure 200 may represent a state of the DRAM structure during the manufacturing process rather than a completed DRAM structure. For example, the DRAM structure 200 may represent a mold that is formed from multiple layers in which the capacitor holes 214 are formed. After the capacitors are formed in the capacitor holes 214, some of the layers illustrated in the DRAM structure 200 may be removed, and the resulting voids may be filled in with other materials to form the final DRAM structure for the memory array.

The DRAM structure 200 may include a metal layer 202 formed from tungsten or other similar conductive materials. The metal layer 202 may represent a control line in the memory array, such as a voltage reference or a select line. A silicon nitride layer 204 may be formed on top of the metal layer 202. Next, multiple layers of oxide materials and nitride materials may be deposited to form the bulk of the mold. For example, the nitride layers 208 may include silicon nitride or silicon carbon nitride (SiCN) that are formed is relatively thin layers in the bulk of the mold. These nitride layers 208 may remain after other materials in the mold are removed. The nitride layers 208 may then mechanically hold the capacitor structures in place after the mold materials are removed and the new materials fill the resulting voids.

Oxide layers may be formed throughout the bulk of the molding between the nitride layers 208. In some embodiments, a single oxide material may be used, such as Tetraethyl orthosilicate (TEOS) or silicon dioxide may be used to form the bulk of the mold material. In other embodiments, multiple oxide materials may be used to avoid excessive tapering when the capacitor holes 214 are etched through the mold. For example, some embodiments may include one or more TEOS layers 210 in an upper portion of the mold, while using one or more layers of borophosphosilicate glass (BPSG) 206 in a lower portion of the mold. The oxide material (e.g., TEOS) used in the upper portion of the mold may be etched at a first rate during an etch process, and the oxide material (e.g., BPSG) used in the lower portion of the mold may be etched at a second rate during the etch process. The second rate may be faster than the first rate such that the oxide material used in the lower portion of the mold etches faster to avoid tapering of the capacitor holes 214. Note that some technology nodes may place a top nitride layer 208-2 directly below the hardmask 212, while other technology nodes may insert an oxide layer 210-2 between the top nitride layer 208-2 and the hardmask 212.

Any etch process may be used to form the capacitor holes 214 through the oxide layers 210, 206, and the nitride layers 208. After the etch process is complete and the capacitor holes 214 are formed, the oxide layers 210, 206 may be removed through a second etch process that is selective to these particular oxide materials. In order to form the capacitor holes 214, the hardmask 214 may be formed on the top of the mold and patterned to form a pattern with openings defining the capacitor holes 214. The pattern in the hardmask 212 may then selectively expose the remaining layers of the mold through the etch process to form the capacitor holes 214 through the depth of the mold.

The hardmask 212 may be formed as amorphous boron (aB) hardmask using the procedures described above for depositing a hardmask on a substrate. Therefore, the hardmask 212 may be referred to as a boron-containing hardmask or a boron-containing material, which should be understood to refer to a hardmask layer composed primarily of boron. In some embodiments, the aB hardmask may be doped with silicon to form an aB(Si) hardmask. When the boron is doped with the material, such as silicon, the boron-containing material may include greater than about 90% boron compared to the doping material (e.g., the silicon). Some embodiments may form an aB(Si) hardmask that is greater than about 95% boron, greater than about 96% boron, greater than about 97% boron, greater than about 98% boron, and substantially 100% boron (i.e., formed primarily from boron precursors excluding trace materials that may be unintentionally included during the deposition process). Some embodiments may also use metal-boride masks where the boron hardmask is doped with various metals using the process described above. For example, many different hardmask films may be used in patterning DRAM structures for etching capacitor holes, and the ion implant process described below may be used with any hardmask. However, aB and aB(Si) hardmasks may be of particular interest in some applications.

With each subsequent DRAM technology node, the holes 214 for the capacitors in the DRAM array may become increasingly smaller in diameter. In order to maintain the capacitance, the depth of the holes 214 for the capacitors may need to increase correspondingly. This requires the process for fabricating the DRAM structure to be able to etch deeper holes compared to each earlier node. Normally, this would require increasing the thickness of the hardmask 212. For example, etching deeper holes 214 generally uses a longer etch process, which requires a thicker hardmask 212 to withstand the longer etch process. However, increasing the thickness of the hardmask 212 increases the overall combined thickness of the hardmask 212 and the holes 214, which leads to a higher aspect ratio and a poorer Critical Dimension Uniformity (CDU) for the holes 214.

It has been discovered that some newer technology nodes have increased the depth of the capacitor holes 214 and/or decreased the diameter of the capacitor holes 214 beyond what existing designs of the hardmask 212 are able to accommodate. Specifically, the increased thickness of the hardmask 212 required to etch the capacitor holes 214 deep enough for the new technology nodes causes poor CDU throughout the capacitor array. Therefore, the embodiments described herein overcome this technical problem by altering the hardmask 212 in order to increase the etch selectivity (ES) beyond existing hardmask compositions composed primarily of boron. Specifically, as the etch selectivity of the hardmask 212 is increased, the thickness of the hardmask 212 may be maintained while increasing the depth of the capacitor holes 214. Because the hardmask 212 is more resistant to the etch process in comparison to the other materials in the mold, the capacitor holes 214 can be etched deeper without increasing the thickness of the hardmask 212.

For example, making taller capacitor holes 214 may begin with making a taller capacitor mold using the materials illustrated in FIG. 2 below the hardmask 212. The taller capacitor mold may then result in etching deeper holes compared to earlier technology nodes. Instead of proportionally increasing the thickness of the hardmask 212 (which in practice leads to poor CDU) these embodiments introduce a hardmask with a higher etch selectivity in order to maintain the thickness of the hardmask 212 while still managing the CDU of the capacitor holes 214. For example, hardmasks comprised of greater than about 90% amorphous boron may have an etch selectivity that is insufficient against the capacitor mold materials. The techniques described herein may increase the etch selectivity of the hardmask 212 relative to the other mold materials by 10% or more when compared to existing boron hardmasks. Specifically, some embodiments may improve the composition of the hardmask 212 by implanting the hardmask 212 with metal ion implants. The hardmask may be altered using a number of techniques, each of which are described in detail below.

There are numerous technical advantages to using an ion implant compared to other previous techniques. For example, ion implants may be contrasted with depositing metal-containing hardmask films directly. Direct deposition of metal-containing films requires developing a new set of deposition, etch, and strip chemistries, which is challenging and time-consuming. Ion implants have been demonstrated to be a much faster and a more versatile tool for evaluating the doping chemistries of many different elements in the film. This allows new hardmasks to be developed, tested, and implemented in production very rapidly. As described above, the ion implants also increase the etch selectivity of the hardmask, which allows the hardmask thickness to be maintained or even reduced depending on the application. Ion implants are also well-suited for manufacturing solutions that offer multiple chamber types. For example, the original boron-containing hardmask may be deposited in one chamber, and the ion implants may be provided in another chamber. These chambers may be part of the same integrated processing tool or platform such that the substrate may be transferred between chambers while maintaining a processing pressure and/or without exposure to an environment outside of the tool or platform. These chambers may also be part of separate tools or platforms.

Figure 3:
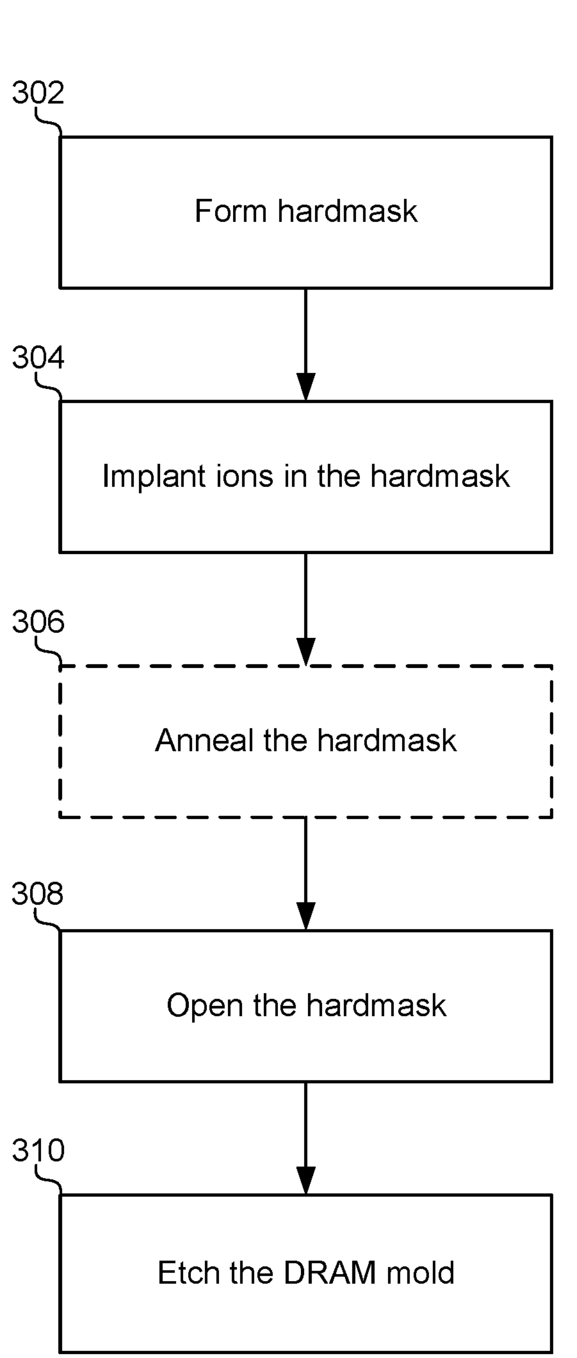
FIG. 3 illustrates a flowchart of a method for forming a hardmask with ion implants, according to some embodiments.

FIG. 3 illustrates a flowchart of a method 300 for forming a hardmask with ion implants, according to some embodiments. The method may include depositing the hardmask (302). The hardmask may be formed on top of a DRAM structure, such as the structure illustrated above in FIG. 2 on a substrate. The substrate may be or include any number of layers on which materials may be deposited. The substrate may be or include silicon, germanium, dielectric materials including silicon oxide or silicon nitride, metal materials, or any number of combinations of these materials, which may be the substrate itself, or materials formed on the substrate. In some embodiments, optional treatment operations (e.g., a pretreatment) may be performed to prepare a surface of the substrate for deposition. For example, a pretreatment may be performed to provide certain ligand terminations on the surface of the substrate, and which may facilitate nucleation of a film to be deposited. For example, hydrogen, oxygen, carbon, nitrogen, or other molecular terminations, including any combination of these atoms or radicals, may be adsorbed, reacted, or formed on a surface of the substrate. Additionally, material removal may be performed, such as reduction of native oxides or etching of material, or any other operation that may prepare one or more exposed surfaces of the substrate for deposition.

The hardmask may be a boron or amorphous boron hardmask. The boron hardmask may be doped with silicon or other materials as described above or may be substantially undoped. The hardmask may be formed in any deposition chamber, such as a dielectric deposition chamber. The hardmask may be deposited to varying thicknesses of between about 1000 Å and about 5000 Å. For example, the hardmask may be between about 1000 Å and about 2000 Å, between about 2000 Å and about 3000 Å, between about 3000 Å and about 4000 Å, between about 4000 Å and about 5000 Å, and greater than about 5000 Å, depending on the depth of the capacitor holes. The thickness of the hardmask may also be any range contained in the ranges described above (e.g., between about 3500 Å and about 4500 Å). The thickness of the hardmask may also be any singular value contained within the ranges described above (e.g., about 3500 Å).

One or more precursors may be delivered to the processing region of the chamber. For example, the film being deposited may be a mask film used in semiconductor processing. The deposition precursors may include any number of mask precursors, including one or more boron-containing precursors. The precursors may be flowed together or separately. For example, in exemplary embodiments in which a boron-containing film may be formed, at least one boron-containing precursor may be delivered to the processing region of the processing chamber. Plasma enhanced deposition may be performed in some embodiments of the present technology, which may facilitate material reactions and deposition. For example, a plasma may be formed of the boron-containing precursors, and a boron-containing material may optionally be deposited.

Boron-containing hardmasks may be characterized by relatively high hardness, which may improve etch selectivity. However, to further improve etch selectivity over underlying silicon-containing materials, such as the silicon oxide or silicon nitride layers that may be present in a DRAM structure, the present technology may incorporate one or more dopant materials, which may include one or more metals. Accordingly, some embodiments may include additionally providing a dopant-containing precursor, and which is provided with the other deposition precursors. The precursors delivered may all be used to form a plasma within the processing region of the semiconductor processing chamber as explained above, and thus the order of operations may include operations occurring in different orders, including concurrently. For example, a material may be deposited on the substrate that includes the dopant within the deposited boron hardmask. By incorporating the dopant-containing precursor in some embodiments, the selectivity of etching may be increased, while producing a film with controlled hardness and transparency.

Depending on the precursors used, a flow rate of the dopant precursor may be used to control incorporation of the dopant. For example, the flow rates of the other deposition precursors may be hundreds of sccm or more, while the dopant precursor may be flowed at a flow rate less than or about 250 sccm, and may be delivered at a flow rate less than or about 200 sccm, less than or about 150 sccm, less than or about 100 sccm, less than or about 50 sccm, less than or about 40 sccm, less than or about 30 sccm, less than or about 25 sccm, less than or about 20 sccm, less than or about 15 sccm, less than or about 10 sccm, less than or about 5 sccm, or less.

Any number precursors may be used with the present technology with regard to the boron-containing precursor. For example, boron-containing materials may include boranes, such as borane, diborane, or other multicenter-bonded boron materials, as well as any other boron-containing materials that may be used to produce boron-containing materials. The boron incorporation in the produced hardmask may be based on any percentage, however most of the hardmasks described herein will include a relatively high boron content relative to any additional dopants. For example, the boron hardmask may include greater than or about 40% boron, the boron hardmask may include greater than or about 50% boron, the boron hardmask may include greater than or about 60% boron, the boron hardmask may include greater than or about 70% boron, greater than or about 75% boron, greater than or about 80% boron, greater than or about 85% boron, greater than or about 90% boron, greater than or about 95% boron, greater than or about 97% boron, greater than or about 98% boron, or greater, including a film that is substantially or essentially boron, less the amount of dopant within the film. Although trace materials from exposure to atmosphere or other process environments may be incorporated within the film, it is to be understood that the film may still be essentially boron-based in nature.

The dopant precursors may include any precursor, including any metal or transition metal that may be delivered to the processing region in a stable form. Some embodiments may use silicon as a precursor to form a silicon-doped boron hardmask. For example, an amorphous boron hardmask may be doped with silicon to form an aB(Si) hardmask. The dopant or dopants may be included in any amount or concentration, and may each or collectively be included at greater than or about 1 at. % in the deposited film, and in some embodiments may be included at greater than or about 2 at. %, greater than or about 3 at. %, greater than or about 4 at. %, greater than or about 5 at. %, greater than or about 6 at. %, greater than or about 7 at. %, greater than or about 8 at. %, greater than or about 9 at. %, greater than or about 10 at. %, greater than or about 11 at. %, greater than or about 12 at. %, greater than or about 13 at. %, greater than or about 14 at. %, greater than or about 15 at. %, greater than or about 16 at. %, greater than or about 17 at. %, greater than or about 18 at. %, greater than or about 19 at. %, greater than or about 20 at. %, or more.

The temperatures of the substrate may additionally impact the deposition. For example, in some embodiments during deposition, the substrate may be maintained at a temperature of greater than or about 300° C., and may be maintained at a temperature of greater than or about 325° C., greater than or about 350° C., greater than or about 375° C., greater than or about 400° C., greater than or about 425° C., greater than or about 450° C., greater than or about 475° C., greater than or about 500° C., greater than or about 525° C., greater than or about 550° C., greater than or about 575° C., greater than or about 600° C., or greater.

As noted above, the present technology may increase selectivity of hard mask films, while limiting a loss in hardness. For example, boron-containing materials according to some embodiments by a film hardness that is maintained at greater than or about 20 GPa, and may be maintained at greater than or about 22 GPa, greater than or about 24 GPa, greater than or about 26 GPa, greater than or about 28 GPa, greater than or about 30 GPa, greater than or about 32 GPa, greater than or about 34 GPa, greater than or about 36 GPa, greater than or about 38 GPa, greater than or about 40 GPa, greater than or about 42 GPa, greater than or about 44 GPa, or more, despite incorporation of some metal materials that may reduce film hardness.

The method may also include implanting ions in the hardmask (304). The ions may be implanted in a separate chamber from the chamber in which the hardmask is deposited. For example, some embodiments may use a high-current (AC) ion implant chamber that delivers a high ion-beam current to implant ions in the hardmask layer. For example, the ion-implant chamber may be part of a separate platform or separate tool from the deposition chamber used to form the hardmask or may be part of the same platform.

In some embodiments, the material used for the ion implants may be limited to metal ions, such as aluminum (Al), gallium (Ga), indium (In), tin, (Sn), lanthanum (La), and/or other similar metals. Some embodiments may use additional metals such as molybdenum (Mo), ruthenium (Ru), tungsten (W), rhenium (Re), osmium (Os), and/or other similar metals or transition metals. Other embodiments need not be limited to metal ions and may additionally or alternatively use nonmetal ions. For example, some embodiments may implant the hardmask with additional boron (B) or silicon (Si) ions. Other embodiments may use ions other than metal ions.

The ion is may be implanted at a high temperature or at room temperature. The ions may be implanted at a range of between about 150° C. and about 550°. For example, the ion implant process may be performed at a range of between about 25° C. and about 150°, between about 150° C. and about 200° C., between about 200° C. and about 250° C., between about 250° C. and about 300° C., between about 300° C. and about 350° C., between about 350° C. and about 400° C., between about 400° C. and about 450° C., between about 450° C. and about 500° C., between about 500° C. and about 550° C., and greater than or about 550° C., depending on the type of ion being implanted and/or the specific ion implant process being used.

As described below, the depth of penetration of the ions in the hardmask may vary depending on the process used and the ion species used. In some embodiments, the depth of the ion implantation may be greater than about 80% of the thickness of the hardmask. For example, the depth of the ion implantation may be greater than or between about 50% to about 60%, greater than or between about 60% to about 70%, greater than or between about 70% to about 80%, greater than or between about 80% to about 90%, greater than or between about 90% to about 100%.

The method may optionally include performing an anneal process (306) on the hardmask after the hardmask is implanted with the ions. The anneal process may be used to activate deposited metals such that the metals bond to the matrix of the hardmask or repair any damage caused by the ion implant. Optionally, the steps of forming the hardmask (302), implanting ions in the hardmask (304), and/or annealing the hardmask (306) may be repeated to grow the thickness of the hardmask. For example, in order to achieve a greater depth of ion penetration in the hardmask, a thin layer of the hardmask may be deposited (e.g., less than about 1000 Å, less than about 2000 Å, and so forth). Ions may then be implanted in this thin layer and the optional anneal may be performed. Another layer of the hardmask may then be deposited, followed by ion implantation, and so forth. A final anneal may additionally or alternatively be performed after multiple layers of the hardmask have been formed. This may result in a full ion penetration depth for each layer of the hardmask, resulting in a hardmask layer with a more complete ion penetration. For example, the ion penetration depth of a single ion process may be between about 200 Å and about 400 Å (e.g., about 350 Å). This process may be repeated in order to provide a hardmask with ion penetration throughout the depth of the hardmask. Alternatively, some ion types may provide greater penetration depths. For example, aluminum may penetrate to a depth of between about 190 Å to about 1900 Å, gallium may penetrate to a depth of between about 190 Å to about 425 Å, depending on the energy of the ion implant process. Even if the entire hardmask layer is not modified by implanted ions, results of shown that boosting the etch selectivity near the top part of the hardmask while leaving the bottom layer under with ions may still provide sufficient benefit in some integration scenarios. For example, the undoped layer near the bottom of the hardmask may be easier to remove after the capacitor holes are etched. If greater ion penetration is needed, another technique is described below in FIG. 4.

The ion implant process may use various energy levels depending on the implant species. Generally, the energy of the ion implant process may vary between about 10 keV and about 100 keV. For example, the energy may vary between about 10 keV and about 20 keV, between about 20 keV and about 30 keV, between about 30 keV and about 40 keV, between about 40 keV and about 50 keV, between about 50 keV and about 60 keV, between about 60 keV and about 70 keV, between about 60 keV and about 70 keV, between about 70 keV and about 80 keV, between about 80 keV and about 90 keV, between about 90 keV and about 100 keV. The energy may also vary between any range within the ranges described above (e.g., between about 22.5 keV and about 60 keV, between about 12 keV and about 60 keV, etc.). The energy may also include any specific values in the ranges above (e.g., about 12 keV, about 27.5 keV, about 22.5 keV, about 32.5 keV, about 60 keV, about 80 keV, etc.).

The method may also include opening the hardmask (308) to expose a patterned layer of the underlying capacitor mold. For example, the capacitor holes may be opened in the hardmask such that a subsequent etch process may access the locations in the underlying mold or DRAM structure for the capacitor holes through the openings in the hardmask. For example, opening the hardmask may include patterning the hardmask with a tetraethyl orthosilicate (TEOS) hardmask deposition, a carbon hardmask deposition, and a lithography stack deposition. The lithography stack may then be patterned through a lithography process, and the pattern may be etched into the carbon layer. The carbon layer may then be used as the hardmask to pattern the TEOS layer. Next, the TEOS layer may be used to pattern the hardmask layer and complete the hardmask opening step. Other processes and materials may be used depending on the embodiment.

The method may next include performing an etch process through the openings in the hardmask to etch the capacitor holes in the mold (310). One way of characterizing the hardmask may include measuring an etch selectivity of the hardmask relative to the other materials in the mold structure. More specifically, some embodiments may characterize the hardmask as an improvement in the etch selectivity of the hardmask in comparison to the hardmask without the ion implants. For example, some embodiments may characterize the hardmask with ion implants as having greater than or about a 10% improvement in the etch selectivity relative to the other mold materials when compared to the same composition of the hardmask without the ion implants. In some embodiments, a 10% improvement in the etch selectivity using the ion implants may result in a corresponding reduction in the thickness of the hardmask. For example, the hardmask using ion implants may result in a 10% reduction in the thickness of the hardmask to etch the capacitor holes.

The improvement in the etch selectivity of the hardmask may be determined by the type of ion used for the ion implants. For example, doping the hardmask with boron (B) ions may improve the etch selectivity of the hardmask by between about 4% and about 7%. Doping the hardmask with indium (In) ions may improve the etch selectivity of the hardmask by between about 1% and about 18%. Doping the hardmask with helium (He) ions may improve the etch selectivity of the hardmask by between about 11% and about 13%. Doping the hardmask with Neon (Ne) ions may improve the etch selectivity of the hardmask by as much as about 13%. Doping the hardmask with lanthanum (La) ions may improve the etch selectivity of the hardmask by between about 4% and about 6%. The etch selectivity may refer to the selectivity of the etch process to the hardmask relative to the underlying semiconductor structure (e.g., an oxide/nitride layer, a TEOS layer, etc.) when etching the capacitor holes.

The improvement of the etch selectivity of the hardmask may also be characterized by how much the thickness of the hardmask may be reduced when using ion implants in comparison to a hardmask of the same material without using ion implants. For example, a boron-based hardmask with ion implants using the materials described above may have a thickness that is 10% less than the same boron-based hardmask without implants to etch the same size capacitor holes (e.g., same CDU, same depth, same width, etc.). In other embodiments, the thickness of the hardmask may be reduced by between about 5% and about 7%, between about 7% and about 9%, between about 9% and about 11%, between about 11% and about 13%, between about 13% and about 15%, between about 15% and about 17%, and/or between about 17% and about 20%. The thickness of the hardmask may also be reduced by any range within these ranges above (e.g., between about 8% and about 12%). The thickness of the hardmask may also be reduced by any specific value within the ranges above (e.g., about 10%).

It should be appreciated that the specific steps illustrated in FIG. 3 provide particular methods of forming a hardmask according to various embodiments. Other sequences of steps may also be performed according to alternative embodiments. For example, alternative embodiments may perform the steps outlined above in a different order. Moreover, the individual steps illustrated in FIG. 3 may include multiple sub-steps that may be performed in various sequences as appropriate to the individual step. Furthermore, additional steps may be added or removed depending on the particular applications. Many variations, modifications, and alternatives also fall within the scope of this disclosure.

As described above, the ion implant process may not be able to penetrate all the way down and/or throughout the thickness of the hardmask. This is particularly true when thicker hardmasks are used. For example, when using indium as an ion implant, the etch selectivity of the hardmask may be increased by more than 10% relative to the underlying semiconductor structures. However, even when implanted with an energy of about 27.5 keV, the depth of penetration of the indium ions may be less than about 400 Å. Additionally, implanting ions in the hardmask may make the hardmask too hard for the traditional hardmask open step where the hardmask layer is patterned to form capacitor holes in the hardmask. Therefore, another method described below may be used to provide greater penetration depth, particularly around the capacitor holes in the semiconductor structure.

Figure 4:
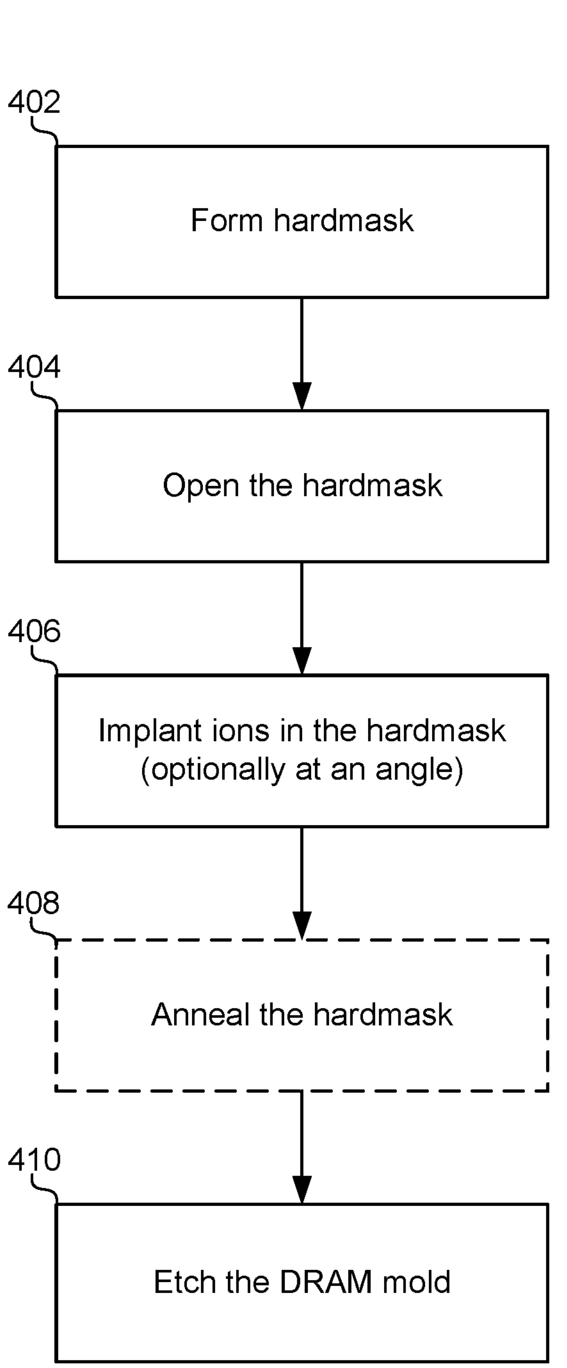
FIG. 4 illustrates a flowchart of a method for forming a hardmask, according to some embodiments.

FIG. 4 illustrates a flowchart of a method 400 for forming a hardmask, according to some embodiments. The method may include forming the hardmask (402) as described above in operation 302 of method 300. For example, this operation may include forming a boron-based hardmask over a semiconductor structure. The boron-based hardmask may include any composition of boron described herein (e.g., greater than about 90% boron, doped with silicon, etc.). The semiconductor structure may include a DRAM structure or mold, which may include a plurality of nitride/oxide layers (e.g., TEOS layers).

The method may also include opening the hardmask with a pattern for a plurality of holes to be formed in the semiconductor substrate (404). The plurality of holes may represent capacitor holes in a DRAM structure. The hardmask may be opened as described above in operation 308 of method 300. Note that instead of applying the ion implants to the hardmask prior to opening the hardmask, this method 400 may first open the hardmask and may then perform the ion implant process.

Figures 5A, 5B:
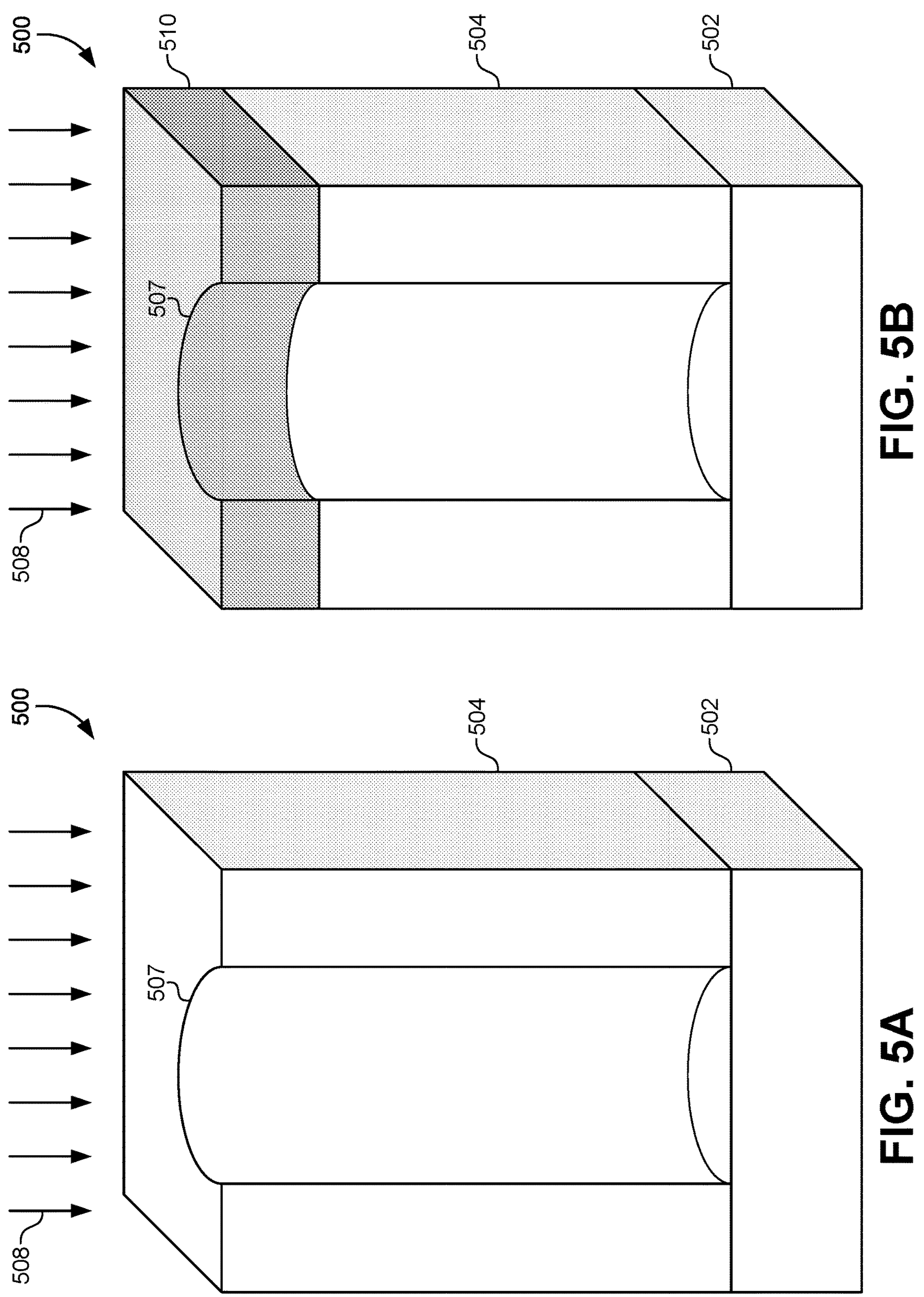
FIG. 5A illustrates a structure with a hardmask that has been opened prior to the ion implant process being performed, according to some embodiments.
FIG. 5B illustrates the structure after the ion implant process, according to some embodiments.

FIG. 5A illustrates a structure 500 with a hardmask 504 that has been opened prior to the ion implant process 507 being performed, according to some embodiments. The hardmask 504 may include an opening 507 that exposes the underlying semiconductor structure 502, such as a top layer of a DRAM structure. The ion implant process 508 may be performed on the hardmask 504 to implant ions in the hardmask 504. Note that the ion implant process 508 may be directed perpendicular to the surface of the hardmask 504 such that the ions penetrate perpendicular to the surface of the hardmask 504.

FIG. 5B illustrates the structure 500 after the ion implant process, according to some embodiments. The hardmask 504 may now include a doped region 510 that has been doped with ion implants. Note that the depth of penetration is similar to the depth of penetration that would be observed in method 300 where the ion implant process 508 may be performed prior to forming the opening 507. However, the opening 507 may be formed before the hardness of the hardmask 504 is increased by the ion implant process 508. This may make the process of opening the hardmask more precise using the techniques described above.

In some embodiments, the ion implant process 508 may additionally or alternatively be performed at an angle that is not perpendicular to the surface of the hardmask 504. Therefore, the method 400 may optionally include implanting the hardmask with ions at an angle into vertical sidewalls of the openings in the hardmask (406). For example, the ion implant process 508 may be performed such that the ions penetrate the surface of the hardmask at an angle that is not perpendicular to the hardmask (e.g., less than) 90°.

Figure 6:
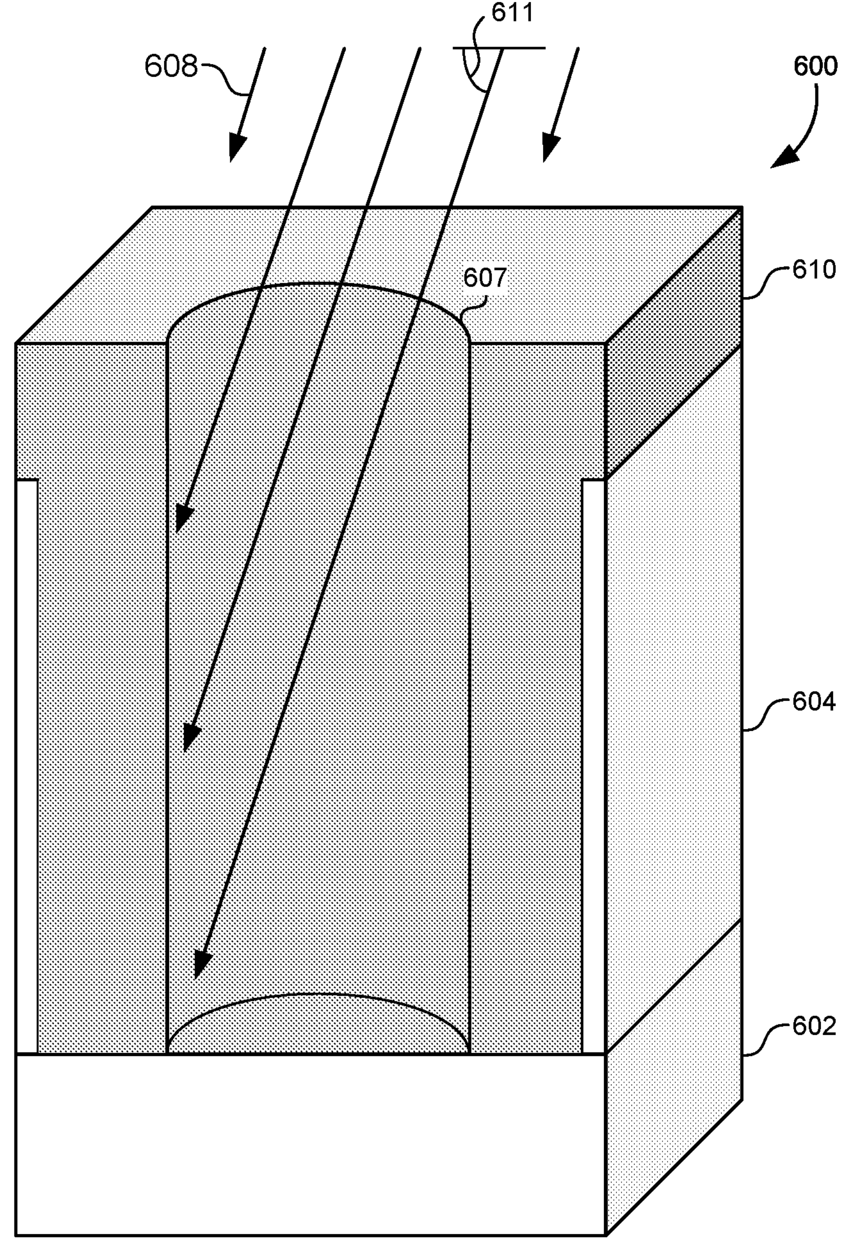
FIG. 6 illustrates a structure where the ion implant process is performed at an angle, according to some embodiments.

FIG. 6 illustrates a structure 600 where the ion implant process is performed at an angle, according to some embodiments. Changing the angle of the ion implant process 608 may be performed by tilting the substrate support in an ion implant semiconductor processing chamber. This may tilt the semiconductor structure 602 relative to the ion implant processes 608. The angle 611 may be less than 90° as illustrated in FIG. 6. The angle of the semiconductor structure 602 and/or the hardmask 604 relative to the ion implant process 608 may allow the ion implant process 608 to penetrate the vertical sidewalls of the opening 607 in the hardmask 604 as illustrated graphically in FIG. 6.

Note that FIG. 6 only illustrates the angle 611 of the ion implant process 608 relative to the semiconductor structure 602. Relative to the ion implant chamber, the ion implant process 608 may still be directed perpendicularly downwards towards the bottom of the chamber. In other words, the absolute direction of the ion implant process need not change. As described above, the angle 611 may be induced by tilting the semiconductor substrate support in the ion implant chamber. In order to cause ion penetration along the full radius of the opening 607, the substrate support may be rotated around an axis (e.g., a center axis). This may allow the penetration of the ions to rotate around the internal radius of the opening 607 and penetrate along the full surface of the opening 607.

Figure 7:
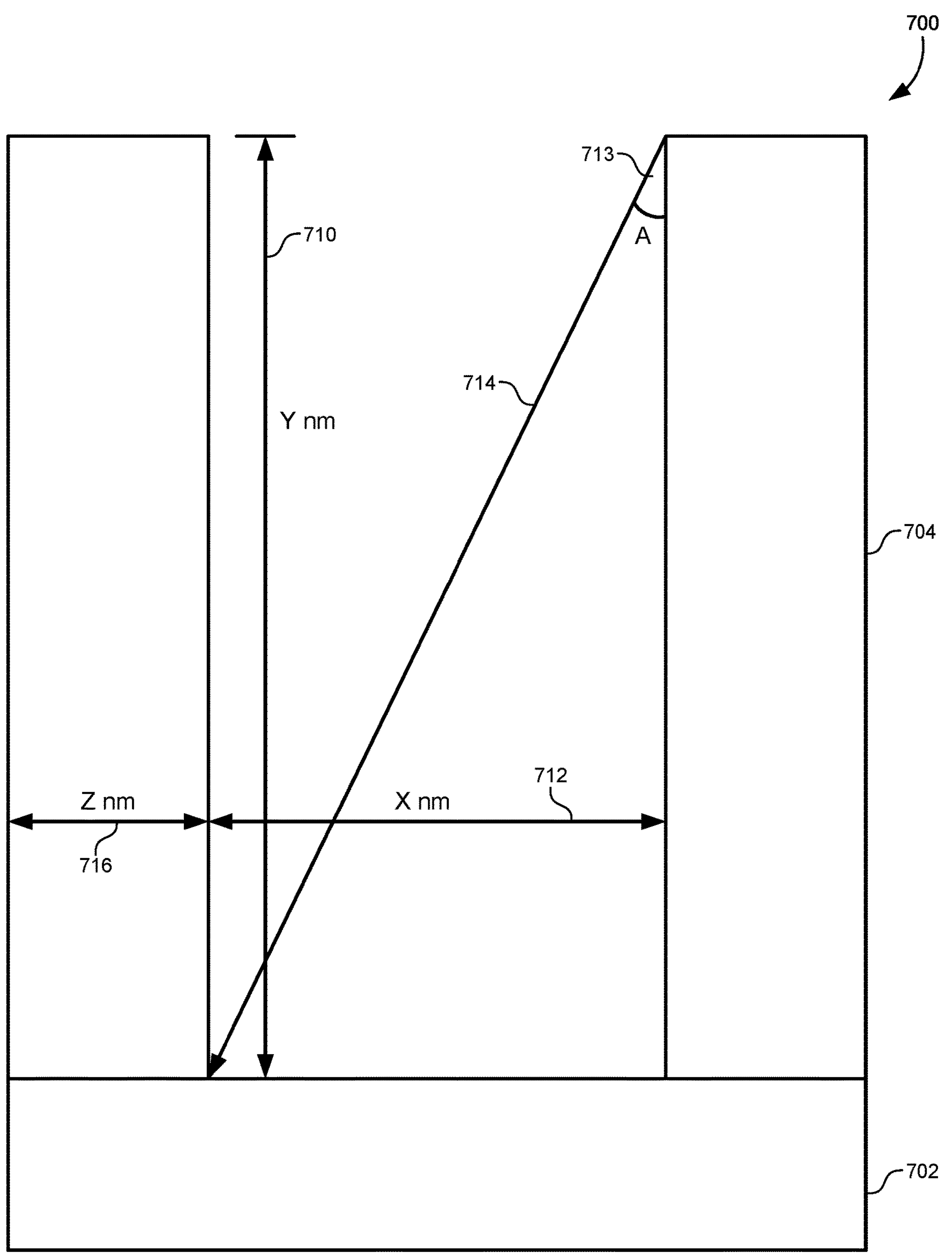
FIG. 7 illustrates a cross-sectional view of the hardmask when the ion implant is performed at an angle, according to some embodiments.

FIG. 7 illustrates a cross-sectional view 700 of the hardmask 704 when the ion implant is performed at an angle, according to some embodiments. The angle 713 (e.g., the tilt angle of the substrate support) may be calculated such that the ion implant process 714 penetrates down to the bottom of the opening. Note that FIGS. 6-7 illustrate only a single opening. However, it should be understood that many other openings may be present in the hardmask 704 as part of the pattern for the capacitor holes. Therefore, the distance 716 may represent a distance between adjacent capacitor holes in the DRAM structure. The angle 713 may be calculated using the thickness 710 of the hardmask 704 and the width 712 of the desired capacitor holes. Basic trigonometric functions may be used with these measurements to calculate the appropriate angle 713.

Although FIG. 7 illustrates the ion implant process 714 penetrating down to the bottom of the hardmask 704 (e.g., to the top of the semiconductor structure 702), the angle may be adjusted to leave a portion of the hardmask 704 undoped by the ions. As described above, this may facilitate the easy removal of the hardmask 704 after the capacitor holes are etched. For example, the angle 713 may be calculated using the desired vertical penetration depth into the hardmask 704 instead of the thickness 710 of the hardmask 704. For example, some embodiments may penetrate to a depth that is less than about 60% of the thickness 710 of the hardmask 704, less than about 70%, less than about 80%, less than about 90%, or less than about 100% of the thickness 710. Some embodiments may also be described having a maximum penetration depth of greater than about 60%, about 70%, about 80%, about 90%, and/or about 100% of the thickness 710 of the hardmask 704. The penetration depth may also be characterized by any value within the ranges described above (e.g., a penetration of about 80%) or by any range encompassed by the ranges described above (e.g., between about 75% and about 85%).

The horizontal depth of penetration of the ions into the sidewalls of the openings in the hardmask 704 may be controlled by the implant energy use during the ion implant process. For example, applying higher energy during the implant process may drive the ions deeper into the sidewalls of the openings. The implant energy may be calculated by determining the distance 716 separating the openings in the hardmask 704. This distance 716 may also correspond to the spacing of the capacitor holes in the DRAM structure. For example, the spacing of the capacitor holes may be divided in half and used as the desired horizontal penetration depth (e.g., half the distance 716 separating the openings, since penetration will come from both sides from adjacent openings).

In some embodiments, method 400 may be combined with method 300 for the ion implant step. For example, the hardmask may be formed, and ions may be implanted vertically into the hardmask before opening. The hardmask may then be opened, and ions may then be implanted at an angle into the sidewalls of the openings. As described above, method 400 may also include an annealing the hardmask (408) and performing an etch to form the plurality of holes in the underlying semiconductor structure (410). For example, the etch may form a plurality of capacitor holes in the DRAM structure through the openings in the boron-based hardmask. The ions may increase the selectivity of the etch of the DRAM structure relative to the boron-based hardmask.

It should be appreciated that the specific steps illustrated in FIG. 4 provide particular methods of forming a hardmask according to various embodiments. Other sequences of steps may also be performed according to alternative embodiments. For example, alternative embodiments may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. Many variations, modifications, and alternatives also fall within the scope of this disclosure.

FIG. 8 illustrates a table 800 listing processing conditions for a number of different species with ion implant recipes used in the ion implant process, according to some embodiments. While many different species may be used, table 800 illustrates ions comprising boron, indium, helium, and neon. These example ion implant process may use energies ranging from about 32.5 keV to about 60 keV, with a dosage of between about 1E+15 ions/cm$^2$ to about 1E+16 ions/cm$^2$.

Table 800 illustrates that the optional anneal process may improve the etch selectivity in comparison to hardmasks that are not annealed after the ion implant. For example, when indium is used as the ion species, the etch selectivity did not show significant change without the anneal process, but showed an etch selectivity improvement of about 17% with the anneal process.

The anneal process may be performed with an argon flow for between about 20-50 minutes (e.g., about 30 minutes) at the temperatures described above (e.g., about 600° C.). The anneal process may be performed after the ion implant process has been completed. Alternatively, the anneal process may be performed concurrently with the ion implant process. For example, the substrate may be heated to greater than about 500° C. The ion implant process may then be performed on the heated substrate, which may exhibit similar results for when a separate anneal process performed after the ion implant process is complete.

Table 800 also illustrates the effect of some non-metal implants, such as neon and helium. Thus some embodiments may use metal ion implants, while other embodiments may use non-metal implants. Even though neon and helium are inert and do not combine with the other elements in the hardmask, some improvement in the etch selectivity of the hardmask is still created when using these non-metal ion implants. For example, metal ion implants may be referred to as having a chemical-driven etch-selectivity improvement. Non-metal implants (e.g., helium, neon, boron, etc.) may have a densification effect and may remove elements, such as hydrogen, that may be embedded in the hardmask film.

As used herein, the terms “about” or “approximately” or “substantially” may be interpreted as being within a range that would be expected by one having ordinary skill in the art in light of the specification.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMS, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A method of forming hardmasks, the method comprising:

in a first semiconductor processing chamber:

delivering a boron-containing precursor to a processing region of a semiconductor processing chamber;

delivering a dopant-containing precursor comprising silicon with the boron-containing precursor to the processing region of the first semiconductor processing chamber, wherein a dopant concentration within the boron-based hardmask is maintained at less than or about 10 at. %;

forming a plasma of all precursors within the processing region of the first semiconductor processing chamber; and forming a boron-based hardmask on a substrate disposed within the processing region of the first semiconductor processing chamber; and in a second semiconductor processing chamber:

implanting the boron-based hardmask with ions.

2. The method of claim 1, wherein the ions are implanted using an ion-beam current to implant the ions in the boron-based hardmask.

3. The method of claim 1, wherein the ions comprise indium ions.

4. The method of claim 1, wherein the ions comprise helium ions.

5. The method of claim 1, wherein the ions comprise neon ions.

6. A method comprising:

forming a Dynamic Random Access Memory (DRAM) structure comprising a plurality of alternating layers of oxide and nitride materials;

forming a boron-based hardmask over the DRAM structure, wherein the boron-based hardmask comprises at least 90 at. % boron;

implanting the boron-based hardmask with ions;

opening the boron-based hardmask with a pattern for a plurality of capacitor holes to be formed in the DRAM structure; and performing an etch to form the plurality of capacitor holes in the DRAM structure through the openings in the boron-based hardmask, wherein implanting the boron-based hardmask with the ions increases a selectivity of the etch of the DRAM structure relative to the boron-based hardmask.

7. The method of claim 6, wherein implanting the boron-based hardmask with the ions increases the selectivity of the etch of the DRAM structure relative to the boron-based hardmask by at least 10%.

8. The method of claim 6, wherein the ions are implanted in the boron-based hardmask to a depth greater than about 50% of a thickness of the boron-based hardmask, and the boron-based hardmask has a thickness of at least 3000 Å.

9. The method of claim 6, wherein the boron-based hardmask is implanted with the ions prior to opening the boron-based hardmask.

10. The method of claim 6, further comprising annealing the boron-based hardmask prior to opening the boron-based hardmask.

11. The method of claim 6, wherein the ions are implanted in the boron-based hardmask prior to opening the boron-based hardmask.

12. A method comprising:

forming a boron-based hardmask over a semiconductor structure, wherein the boron-based hardmask comprises at least 90 at. % boron;

opening the boron-based hardmask with a pattern for a plurality of holes to be formed in the semiconductor structure;

tilting a substrate support in a semiconductor processing chamber to tilt the semiconductor structure relative to an ion implant process; and implanting the boron-based hardmask with ions using the ion implant process wherein tilting the substrate implants the ions at an angle in vertical sidewalls of a plurality of openings in the boron-based hardmask.

13. The method of claim 12, wherein the ions are implanted in the boron-based hardmask to a depth greater than about 80% of a thickness of the boron-based hardmask.

14. The method of claim 12, further comprising annealing the boron-based hardmask after opening the boron-based hardmask.

15. The method of claim 14, further comprising performing an etch to form the plurality of holes in the semiconductor structure through the openings in the boron-based hardmask, wherein implanting the boron-based hardmask with the ions increases the selectivity of the etch of the semiconductor structure relative to the boron-based hardmask by at least 10%.

16. The method of claim 15, wherein a critical dimension of the plurality of holes is at least 15:1.

17. The method of claim 15, wherein a depth of the plurality of holes is at least 300 nm.

18. The method of claim 15, wherein the selectivity of the etch is increased by at least 15%.

* * * * *